(12) United States Patent
Honda et al.

(10) Patent No.: US 7,901,992 B2
(45) Date of Patent: Mar. 8, 2011

(54) DIE BONDING AGENT AND A SEMICONDUCTOR DEVICE MADE BY USING THE SAME

(75) Inventors: Tsuyoshi Honda, Annaka (JP); Tatsuya Kanemaru, Karuizawa-machi (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 158 days.

(21) Appl. No.: 12/081,992

(22) Filed: Apr. 24, 2008

(65) Prior Publication Data

US 2008/0265439 A1    Oct. 30, 2008

(30) Foreign Application Priority Data

Apr. 26, 2007  (JP) ................................ 2007-117126

(51) Int. Cl.
*H01L 21/00* (2006.01)
(52) U.S. Cl. ..... 438/118; 257/782; 257/783; 257/E23.04
(58) Field of Classification Search ............. 257/E23.04; 438/118
See application file for complete search history.

(56) References Cited

U.S. PATENT DOCUMENTS

| 5,475,048 A * | 12/1995 | Jamison et al. ............... 524/439 |
| 5,889,332 A * | 3/1999 | Lawson et al. ................ 257/778 |
| 6,445,076 B1 | 9/2002 | Shimizu et al. |
| 2007/0026572 A1 | 2/2007 | Hatakeyama et al. |
| 2007/0290369 A1* | 12/2007 | Hasegawa et al. ............. 257/783 |

FOREIGN PATENT DOCUMENTS

| JP | 2005303275 A | 10/2005 |
| JP | 2006-005159 A | 1/2006 |
| WO | WO-99/60622 A1 | 11/1999 |

\* cited by examiner

*Primary Examiner* — Ajay K Arora
(74) *Attorney, Agent, or Firm* — Birch, Stewart, Kolasch & Birch, LLP (57) ABSTRACT

A die bonding agent comprising (A) an epoxy resin, (B) a curing agent, and (C) an inorganic filler, the die bonding agent having a viscosity ratio, V1/V2, ranging
(i) from 1.5 to 4 at a temperature of from room temperature to 50° C., and
(ii) from 0.5 to less than 1.5 at a temperature at which the die bonding agent hardens in 0.5 hour to 1.5 hours, the viscosities being measured in 10 minutes after the die bonding agent is placed on a sample stage of a Brook Field viscometer, wherein V1 is a viscosity measured by stirring 0.5 ml of the die bonding agent with a No. 51 spindle at 0.5 rpm and V2 is a viscosity measured by stirring 0.5 ml of the die bonding agent with a No. 51 spindle at 5 rpm in the Brook Field viscometer.

10 Claims, 6 Drawing Sheets

DIE BONDING AGENT AND A SEMICONDUCTOR DEVICE MADE BY USING THE SAME

CROSS REFERENCE

This application claims benefit of Japanese Patent application No. 2007-117126 filed on Apr. 26, 2007, the contents of which are hereby incorporated by reference.

Field of the Invention

The present invention relates to a die bonding agent which can form a fillet having a specific shape, a semiconductor device made by using the die bonding agent, and a method of controlling quality of the die bonding agent. The die bonding agent is suitable for preparing a downsized, highly integrated and reliable semiconductor device.

Background of the Invention

A die bonding agent is an adhesive to bond a semiconductor chip to a substrate. Widely used die bonding agents comprise an epoxy resin as those described in the Japanese Patent Application Laid-Open No. 2006-5159 and 2005-303275.

A die bonding agent is usually evaluated in terms of adhesion strength, and resistant to moisture and heat. However, a die bonding agent showing excellent adhesion strength often suffers delamination at an interface between the die bonding agent and a substrate. Particularly, in a device comprising a chip encapsulated with an encapsulant having liner expansion coefficient different from that of a die bonding agent, a large stress is generated at an interface between the die bonding agent and the encapsulant which stress causes interfacial delamination or cracks in a fillet in thermal cycle test.

Meanwhile, a downsizing and higher integration of a semiconductor device is required. To meet the requirement, it is very important to control size and shape of a fillet of a die bonding agent. If a fillet is too large, a bonding point of a wire such as gold wire, connecting a chip with a circuit on a substrate should be far from a chip, so that downsizing or higher integration is prevented.

International Patent Publication WO 99/60622 describes an adhesive having a specific molecular weight and a viscosity ratio at 25° C. which does not protrude or dip from a lead flam. However, further improvement is desired.

SUMMARY OF THE INVENTION

An object of the present invention is to provide a die bonding agent which can form a fillet having a specific size and shape, and a semiconductor device prepared by using the die bonding agent.

The present inventors have found that size and shape of a fillet can be controlled by using a die bonding agent which satisfies specific rheological properties at a temperature of die-bonding, i.e, of from room temperature to 50° C., and at a temperature of curing, whereby the aforesaid problems such as delamination can be prevented and downsizing can be attained.

The present invention is a die bonding agent comprising (A) an epoxy resin, (B) a curing agent, and (C) an inorganic filler, the die bonding agent having a viscosity ratio, V1/V2, ranging (i) from 1.5 to 4 at a temperature of from room temperature to 50° C., and (ii) from 0.5 to less than 1.5 at a temperature at which the die bonding agent hardens in 0.5 hour to 1.5 hours, the viscosities being measured in 10 minutes after the die bonding agent is placed on a sample stage of a Brook Field viscometer, wherein V1 is a viscosity measured by stirring 0.5 ml of the die bonding agent with a No. 51 spindle at 0.5 rpm and V2 is a viscosity measured by stirring 0.5 ml of the die bonding agent with a No. 51 spindle at 5 rpm in the Brook Field viscometer.

The present die bonding agent forms a fillet having a size and shape appropriate for attaining downsizing, higher integration and improved reliability of a semiconductor device.

PREFERRED EMBODIMENTS OF THE INVENTION

Figure 1:
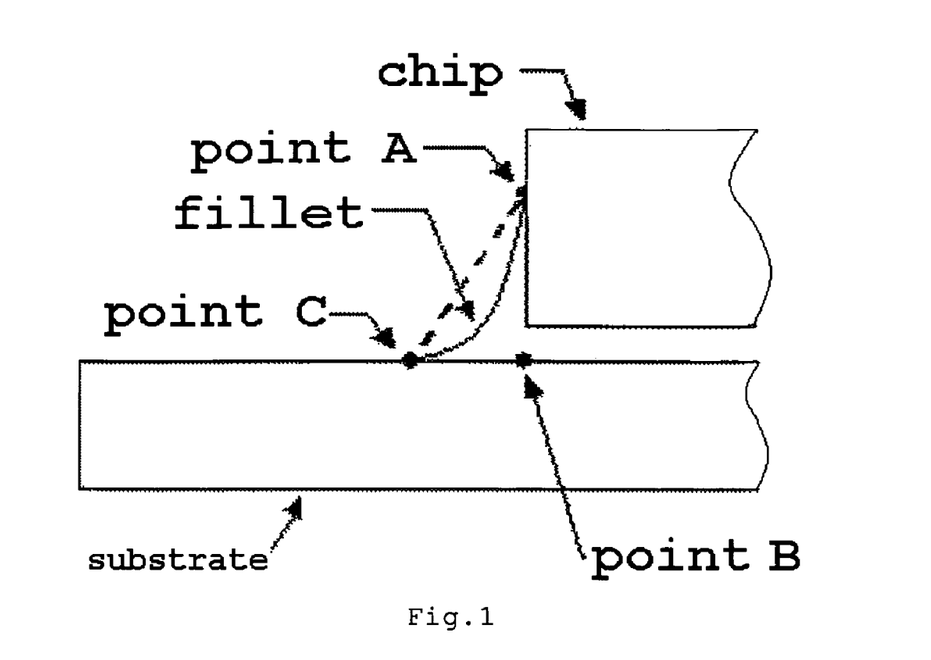
FIG. 1 is a schematic cross-sectional diagram of a fillet.

The present inventors have found that a shape of a fillet, specifically a cross-sectional shape along an line-symmetric axis of the chip, which allows downsizing, high integration and high reliability has the following characteristics (I) and (II). Referring to FIG. 1, let the highest point of a fillet in contact with a semiconductor chip side surface be point A, a point of the fillet on a substrate farthest from the chip be point C, and a foot of an imaginary perpendicular line drawn from A to the substrate be point B, then (I) a distance between point B and point C is shorter than a distance between point A and point B; and (II) the cross-sectional shape of the fillet does not protrude out of an imaginary line A-C.

Figure 2:
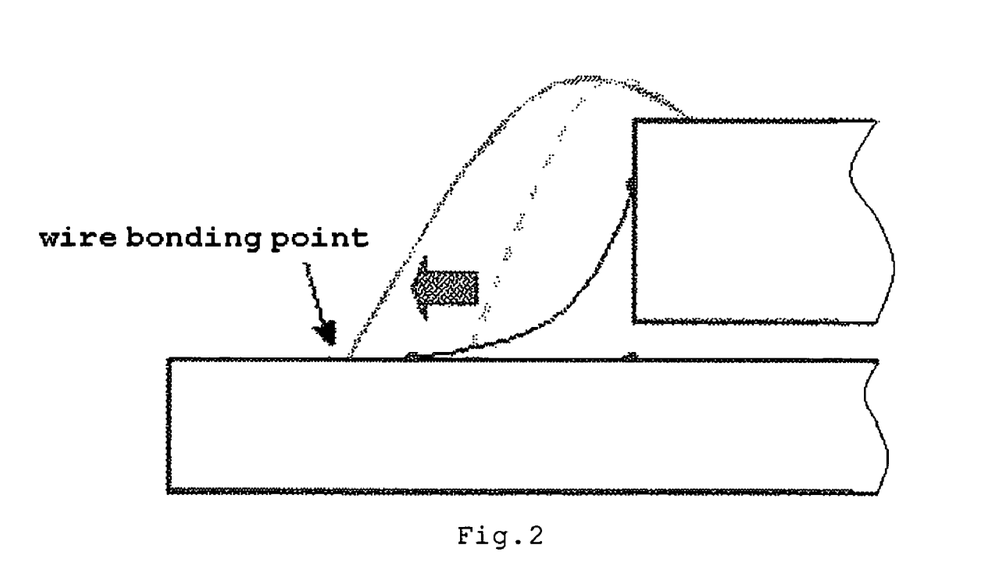
FIG. 2 is a schematic diagram showing spatial relationship between a cross section of a fillet and a wire.

The characteristic (I) indicates that a fillet spreads on a substrate a little. This allows a bonding point of a gold wire on a substrate to be close to the chip end, whereby downsizing and high integration of a device can be attained. On the other hand, a distance B-C which is larger than distance A-B causes boning points to be located far from the chip, preventing downsizing and high integration. The schematic diagram FIG. 2 shows this wherein a bonding point of a wire in dotted line is closer to the chip than that of a wire in full line.

Figure 3:
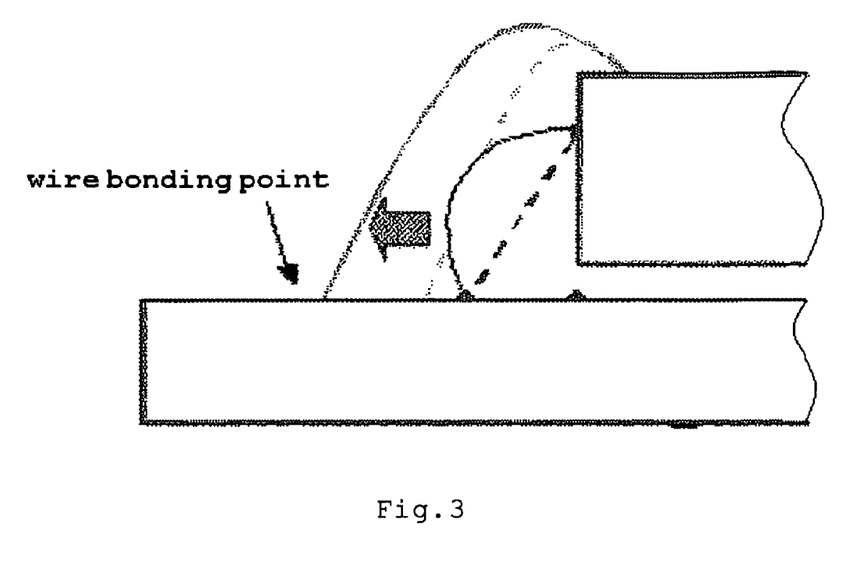
FIG. 3 is a schematic diagram showing spatial relationship between a cross section of a fillet and a wire.

The characteristic (II) indicates that a fillet does not have a bulging form. This attains the same advantage as the characteristic (I). As schematically shown in FIG. 3, when a fillet has a bulging form, a wire should loop around the fillet to be bonded far from a chip end.

In addition to the aforesaid advantage, a device meeting the characteristics I and II attains another advantage. That is, such a device hardly suffers from defects, for example, interfacial delamination which is often caused in a resin encapsulation process and/or in subsequent processes. This advantage is explained below, taking an example of a semiconductor device in which a chip is bonded to a substrate via a cured die bonding agent and electronically bonded with gold wires, which are encapsulated with an epoxy resin to protect the chip from impact and moisture.

Generally, the epoxy resin encapsulant contains inorganic fine powder such as silicon dioxide powder. A die bonding agent also contains similar inorganic powder in addition to an epoxy resin or an acrylic resin. Usually, the encapsulant contains more inorganic powder than the die bonding agent, resulting in difference in thermal expansion coefficient between the encapsulant and the die bonding agent. This difference causes large stress at an interface between the encapsulant and die bonding agent, which may lead to delamination at the interface or cracks in fillets of the die bonding agent in a thermal cycle test. To avoid this problem, one may increase adhesion between the die bonding agent and the encapsulant or decrease modulus of elasticity of the die bonding agent and the encapsulant to relieve the stress.

Figure 4:
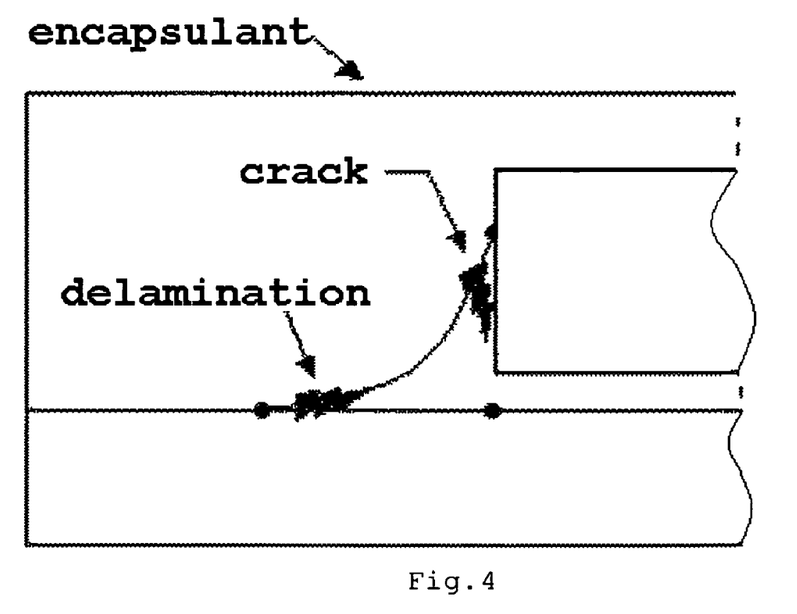
FIG. 4 is a schematic diagram of a cross section of an encapsulated semiconductor device.

With fillets having the characteristics I and II, the stress can be decreased. On the other hand, fillets having a distance B-C longer than that of A-B have larger interface area between an encapsulant and a substrate, so that they tends to suffer from delamination or cracks in the fillets. FIG. 4 schematically explains this.

Figure 5:
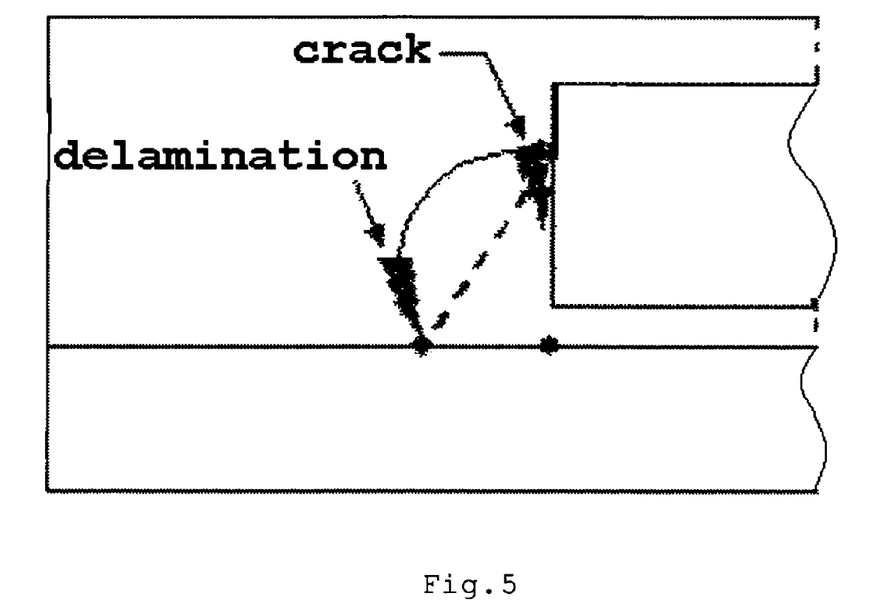
FIG. 5 is a schematic diagram of a cross section of an encapsulated semiconductor device.

Referring to FIG. 5, in a device which fails to meet the characteristic II, large stress generates at an interface between a die bonding agent and an encapsulant and/or a chip, causing delamination or cracks in fillets.

The fillets having the aforesaid characteristics can be formed from a die bonding agent having a viscosity ratio at 0.5 rpm (V1) to a viscosity at 5 rpm (V2), which are measured by stirring 0.5 ml of the die bonding agent with a No. 51 spindle of a Brook Field viscometer, (i) of from 1.5 to 4 at a temperature of from room temperature to 50° C., and (ii) of from 0.5 to less than 1.5 at a temperature at which the die bonding agent hardens in 0.5 hour to 1.5 hours. The viscosities are measured in 10 minutes after the die bonding agent is placed on a heated sample stage of the Brook Field viscometer.

The characteristic (i) reflects rheological property of the die bonding agent in a die bonding process, and (ii) reflects rheological property immediately before it fully hardens. The aforesaid conditions of the viscosity measurements may be modified for other viscosity measurement means such as a rheometer.

Figure 6:
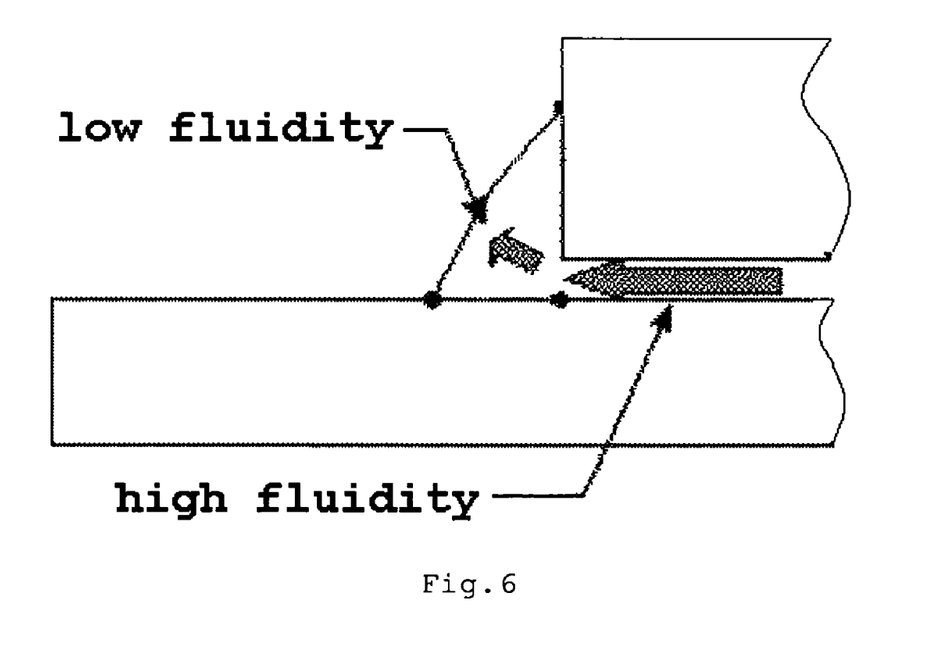
FIG. 6 is a schematic diagram explaining movements of a die bonding agent in a die bonding process.

The characteristic (i) indicates that a die bonding agent applied on a substrate rapidly reaches to an end of a chip when force is loaded thereon via the chip in a die bonding process, and it quits spreading upon unloading the force to remain close to the chip end. This is schematically illustrated in FIG. 6.

Figure 7:
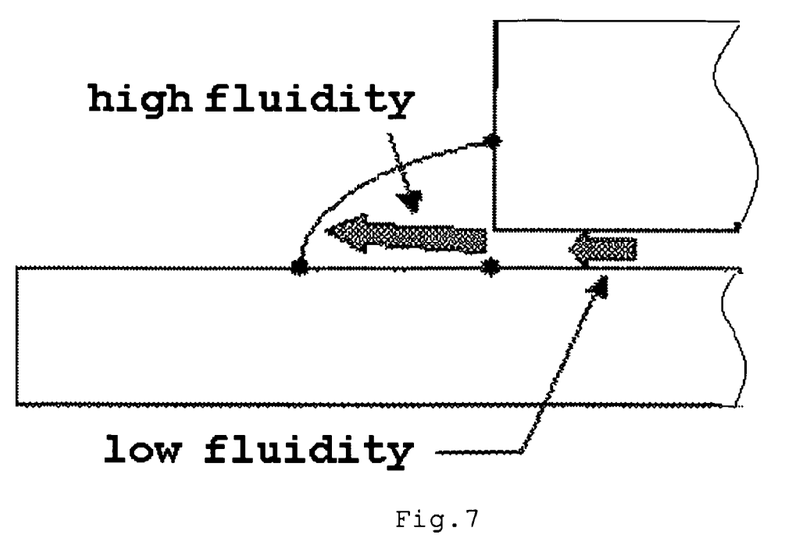
FIG. 7 is a schematic diagram explaining movements of a die bonding agent in a die bonding process.

A die bonding agent which fails to meet the characteristic (i) does not reach the chip end rapidly when force is applied, because of its lower fluidity. After the force is unloaded, on the other hand, the fluidity does not decrease enough for it to remain close to the chip end, resulting in extended fillet. This is schematically illustrated in FIG. 7. Preferably, the ratio, V1/V2, ranges from 1.5 to 3.5 at a temperature of from room temperature to 50° C.

Figure 8:
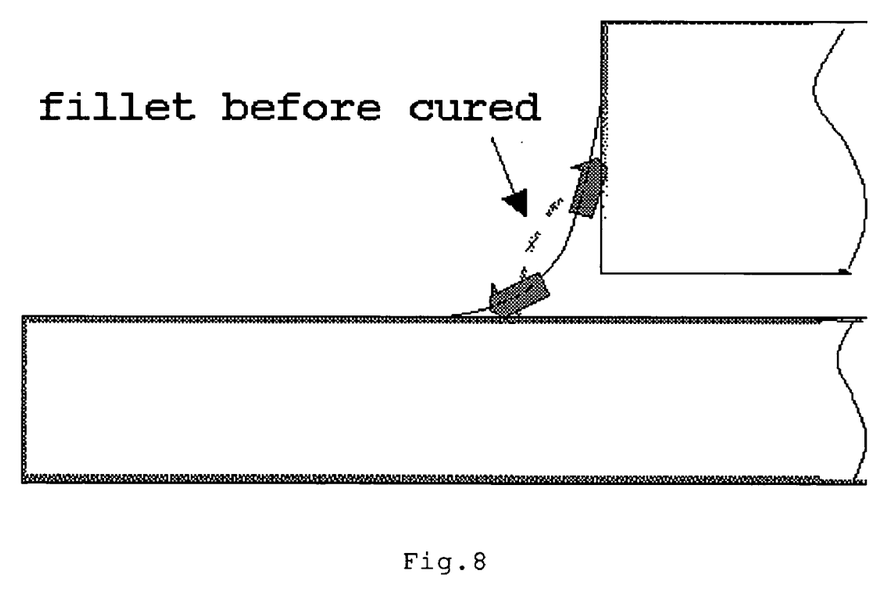
FIG. 8 is a schematic diagram explaining movements of a die bonding agent in a curing process.

The characteristic (ii) indicates that, in the absence of external force, a fillet of a die bonding agent has such fluidity that it transforms along an end surface of a chip into a stress resistant form, while staying close to the end of the chip. This is schematically illustrated in FIG. 8.

Figure 9:
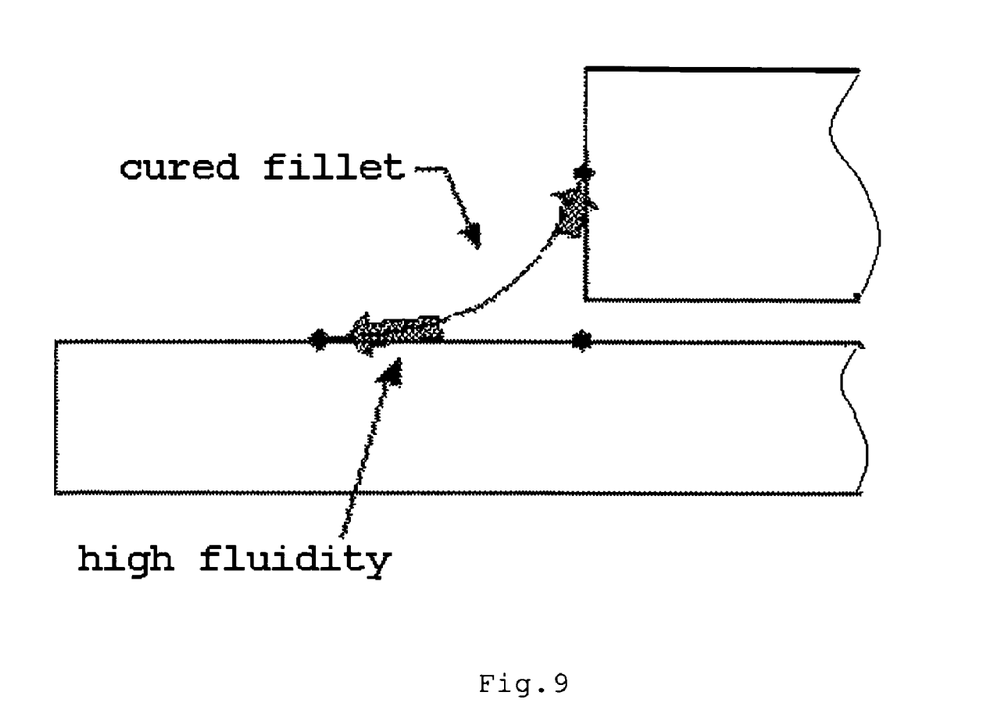
FIG. 9 is a schematic diagram explaining movements of a die bonding agent in a curing process.

The aforesaid temperature at which a die bonding agent substantially hardens or gelates in 0.5 to 1.5 hours is a temperature at which curing is performed. The temperature can be determined by thermal analysis such as Differential Scanning Calorimetry (DSC). The hardening or gelation may not be complete. That is, hardening or gelation may be such an extent that the hardened or gelated die bonding agent shows adhesion strength large enough for practical use, which may be smaller than maximum adhesion strength. Typically, the temperature ranges from 130 to 170° C. The viscosities are measured in 10 minutes, preferably 2 to 7 minutes, after placing a die bonding agent on a heated sample stage of a viscometer. If the viscosity ratio is less than 0.5, a fillet tends to spread far from an end surface of a chip in the absence of an external force, preventing high integration of a semiconductor device. This is schematically illustrated in FIG. 9.

Figure 10:
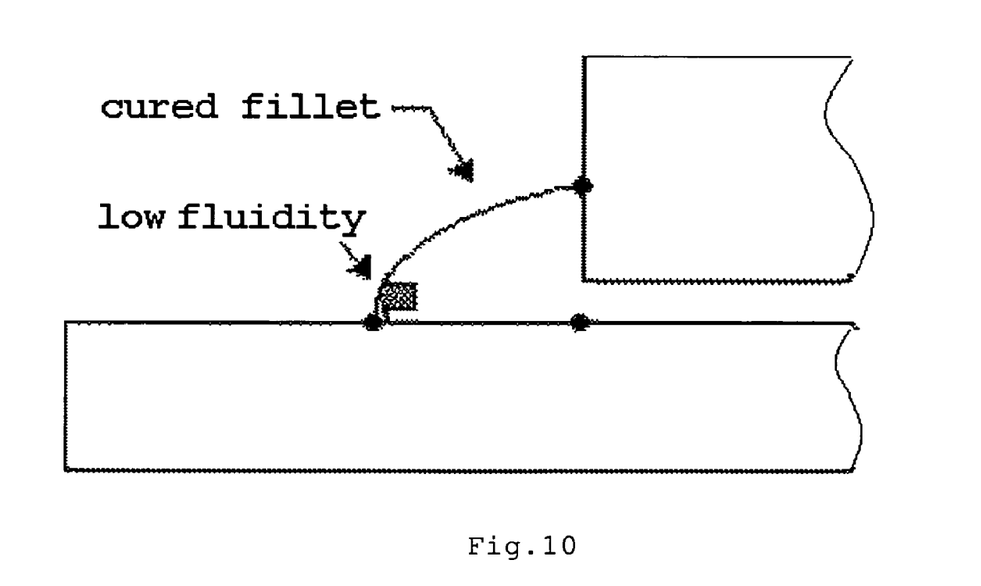
FIG. 10 is a schematic diagram explaining movements of a die bonding agent in a curing process.

If the viscosity ratio is 1.5 or larger, fillets cannot change their shapes into stress resistant forms due to insufficient fluidity in the absence of external force, which may cause interfacial delamination between the chip and the substrate. This is schematically illustrated in FIG. 10. Preferred viscosity ratio ranges from 0.8 to 1.4.

The aforesaid viscosity ratios can be used as indices for evaluating or controlling rheological quality of a die bonding agent in a semiconductor device production process. Thus, the present invention also provides a method of evaluating or controlling quality of a die bonding agent used for a semiconductor chip in a semiconductor device production process determining a viscosity ratio, V1/V2, (i) at a temperature ranging from room temperature to 50° C., and (ii) at a temperature at which the die bonding agent hardens in 0.5 to 1.5 hours, the viscosities being measured in 10 minutes after the die bonding agent is placed on a sample stage of a Brook Field viscometer, wherein V1 is a viscosity measured by stirring 0.5 ml of the die bonding agent with a No. 51 spindle at 0.5 rpm and V2 is a viscosity measured by stirring 0.5 ml of the die bonding agent with a No. 51 spindle at 5 rpm in a Brook Field viscometer.

The step (ii) may be performed only for a die bonding agent which shows the viscosity ratio, V1/V2, of from 1.5 to 3.5 in the step (i).

The present die bonding agent attaining the above rheological properties comprises (A) an epoxy resin, (B) curing agent and (C) inorganic filler, each of which is explained below.

(A) Epoxy Resin

As the epoxy resin (A) in the present invention, a known epoxy resin can be used. Examples of the epoxy resin include novolac type, bisphenol type, biphenyl type, phenolaralkyl type, dicyclopentadiene type, naphthalene type, amino group-containing type, and after-mentioned silicone-modified type epoxy resins, and a mixture of these epoxy resins. Among these, bisphenol-A type, bisphenol-F type and silicone-modified type epoxy resins are preferred. Preferably, an epoxy resin which is liquid at 25° C., more preferably, the one having a viscosity of 100 Pa·s or smaller, particularly 10 Pa·s or smaller, at 25° C. is used.

(B) Epoxy Resin Curing Agent

As the curing agent (B), known curing agents can be used such as phenolic resins, after-mentioned silicone modified phenolic reins, acid anhydrides, and amines. Among these, the phenolic resins and silicone modified-phenolic resins are preferred for the reason that a well-balanced curing property and B-stage stability can be attained. Examples of the phenolic resins include novolac type, bisphenol type, trishydroxyphenylmethane type, naphthalene type, cyclopentadiene type, phenolaralkyl type phenolic resins and a mixture thereof, among which novolac type and bisphenol type phenolic resins are preferred. The phenolic resin preferably has a viscosity of 10 Pa·s or smaller, particularly 1 Pa·s or smaller, at 100° C.

Preferably, at least a part of the epoxy resin (A) or the curing agent (B), particularly the phenolic resin, is a silicone-modified resin having a silicone residue in a molecule. An example of the silicone-modified resin is a copolymer prepared by reacting an aromatic polymer with an organopolysiloxane. Examples of the aromatic polymers are those represented by the following formulas (3) and (4):

(3)

(4)

wherein $R^{11}$ is a hydrogen atom when the above aromatic polymers are phenolic resins, or an oxyrane group shown below when the above aromatic polymers are epoxy resins;

$R^{12}$ is a hydrogen atom or a methyl group, X is a hydrogen atom or a bromine atom, n is an integer of 0 or greater, preferably of from 0 to 50, particularly from 1 to 20.

Other examples of the aromatic polymers are those having an alkenyl group as represented by the following formulas (5) to (8):

(5)

(6)

(7)

(8)

wherein $R^{11}$, $R^{12}$, X and n are as defined above, m is an integer of 0 or larger, preferably of from 0 to 5, particularly 0 or 1.

The organosiloxane to be reacted with the aforesaid aromatic polymer is represented by the following formula (9):

$$(R^{13})_a(R^{14})_b SiO_{(4-a-b)/2} \quad (9)$$

wherein $R^{13}$ is a hydrogen atom, an organic group having an amino, epoxy, hydroxyl, or carboxyl group, or an alkoxy group, $R^{14}$ is a substituted or non-substituted monovalent hydrocarbon group, hydroxyl, alkoxy, or alkenyloxy group, a is a number of from 0.001 to 1, and b is a number of from 1 to 3, with a+b ranging from 1 to 4. One molecule of the organosiloxane contains 1 to 1,000 silicon atoms and at least one $R^{13}$ bonded to a silicon atom.

Examples of the organic group having an amino group as $R^{13}$ include the following groups, wherein c is 1, 2 or 3.

Examples of the organic group having an epoxy group include the following groups, wherein c is 1, 2 or 3.

Examples of the organic group having a hydroxyl group include the following groups, wherein d is 0, 1, 2, or 3 and e is 1, 2, or 3.

An example of the organic group having a carboxyl group is the following one, wherein f is an integer of from 1 to 10.

Examples of the alkoxy group include those having 1 to 4 carbon atoms such as methoxy, ethoxy, and n-propoxy group.

Preferred examples of $R^{14}$, a substituted or non-substituted monovalent, include monovalent group having 1 to 10 carbon atoms, for example, $C_{1-10}$ alkyl groups such as methyl, ethyl, n-propyl, isopropyl, n-butyl, isobutyl, tert-butyl, pentyl, neopentyl, hexyl, cyclohexyl, octyl, and decyl groups; alkenyl groups such as vinyl, allyl, propenyl, and butenyl groups; aryl groups such as phenyl and tolyl groups; aralkyl groups such as benzyl and phenylethyl groups; and partly or fully halogenated groups thereof.

In the formula (9), a and b are as defined above, preferably a ranges from 0.01 to 0.1 and b ranges from 1.8 to 2, with a+b ranging from 1.85 to 2.1. A number of silicon atoms preferably ranges from 2 to 400, particularly 5 to 200. Examples of such organopolysiloxane are those represented by the following formulas (10) and (11):

wherein $R^{16}$ is a monovalent organic group having an amino, epoxy, hydroxyl, or carboxyl group; $R^{15}$ is a substituted or non-substituted monovalent hydrocarbon group, preferably methyl or phenyl group; p is an integer of from 0 to 1000, preferably from 3 to 400, and q is an integer of from 0 to 20, preferably from 0 to 5.

Examples of such organopolysiloxane are as shown below.

The organopolysiloxane of the formula (9) preferably has a molecular weight of from 100 to 100,000. Such an organopolysiloxane tends to form a homogeneous molecular structure, where the organopolysiloxane moieties are homogeneously dispersed in an aromatic polymer matrix, or a sea-island structure where an organopolysiloxane phase is separated from a matrix phase, depending on molecular weight and structure of the aromatic polymer to be reacted with the organopolysiloxane.

The organopolysiloxane having a relatively low molecular weight, particularly the one having a molecular weight of from 100 to 10,000, tends to form the homogeneous structure, whereas the one having a relatively high molecular weight, particularly of from 1,000 to 100,000 tends to form the sea-island structure. It is determined depending on an intended use of the composition which structure is to be selected. An organopolysiloxane having a molecular weight smaller than 100 is not preferred because it tends to give a composition which forms a hard and brittle cured product. The one having a molecular weight larger than 100,000 is not preferred either, because it tends to form a coarse see-island structure which may cause local stresses in a cured product.

The reaction between the aromatic polymer and the organopolysiloxane can be performed according to a known method, for example, an addition reaction using a platinum catalyst.

In the composition of the present invention, a mixing ratio of the epoxy resin (A) to a curing agent (B), as an equivalent ratio of the epoxy group to a functional group reactive with the epoxy group, ranges from 0.8 to 1.25, preferably from 0.9 to 1.1. If the mixing ratio is outside the aforesaid range, quality of a cured product and a semiconductor device comprising the cured product may be adversely affected due to unreacted component.

(C) Inorganic Filler

Examples of the inorganic filler include fused silica, crystallized silica, alumina, titanium oxide, silica titania, boron nitride, aluminum nitride, silicon nitride, magnesia, magnesium silicate, talc, and mica. A mixture of two or more of these can be used. Preferably, at least one selected from silica, alumina and talc is used.

The inorganic filler preferably has a maximum particle size of at most 20%, particularly at most 10%, of a thickness of applied die bonding agent, and has an average particle size of at most 10%, particularly 5%, of a thickness of applied die bonding agent. Inorganic filler having a maximum particle size or an average particle size larger than the aforesaid size may damage a silicon chip, substrate, or gold wire, or cause stress at an interface between the inorganic filler and its surrounding, which may impair functions of a semiconductor device.

The inorganic filler is preferably pretreated with a silane coupling agent. More preferably, the epoxy resin (A) and the surface-treated inorganic filler are premixed at a reduced pressure, whereby the surface of the inorganic filler is thoroughly wet by the epoxy resin, leading to significantly improved moisture resistance.

Examples of the silane coupling agent include γ-glycidoxypropyltrimethoxysilane, γ-glycidoxypropylmethyldiethoxysilane, γ-glycidoxypropyltriethoxysilane, p-styryltrimethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-β(aminoethyl)γ-aminopropylmethyldimethoxysilane, N-β(aminoethyl)γ-aminopropyltrimethoxysilane, N-β(aminoethyl)γ-aminopropyltriethoxysilane, γ-aminopropyltrimethoxysilane, γ-aminopropyltriethoxysilane, N-phenylγ-aminopropyltrimethoxysilane, γ-mercaptopropylmethyldimethoxysilane, γ-mercaptopropyltrimethoxysilane, bis(triethoxypropyyl) tetrasulfide, and γ-isocyanate propyltriethoxysilane. A mixture of two or more of these can be used. Among these, γ-glycidoxypropyltrimethoxysilane is preferred.

Preferred inorganic filler is silica which is incorporated in the die bonding agent in an amount of from 1 to 400 parts by weight, preferably from 10 to 200 parts by weight per total 100 parts by weight of the components (A), (B) and (C).

(D) Curing Promoter

The present die bonding agent may comprise (D) curing promoter. Known curing promoter can be used, for example, organic phosphorous compounds, imidazols, and tertiary amine compounds. Examples of the organic phosphorous compounds include triphenylphosphine, trubutylphosphine, tri(p-tolyl)phosphine, tri(p-methoxyphenyl)phosphine, tri(p-ethoxyphenyl)phosphine, triphenylphosphine-triphenylborate derivatives, and tetraphenylphosphine-tetraphenylborate derivatives. Examples of imidazol include 2-methylimidazol, 2-ethylimidazol, 2-ethyl-4-methylimidazol, 2-phenylimidazol, 2-phenyl-4-methylimidazol, 2-phenyl-4-methyl-5-hydroxymethylimidazol, and 2-phenyl-4,5-dihyroxymethylimidazol. Examples of tertiary amine include triethylamine, benzyldimethylamine, α-methylbenzyldimethyl amine, and 1,8-diazabicyclo(5,4,0)undecene-7. Among these, tetraphenylphosphine-tetraphenylborate derivatives, or methyrol imidazol derivatives are preferably used in combination with the phenolic resin curing agent.

The curing promoter (D) is contained preferably in an amount of from 0.1 to 10 parts by weight, particularly 0.2 to 5 parts by weight, per total 100 parts by weight of the epoxy resin (A) and the epoxy resin curing agent (B). With the curing promoter (D) less than the aforesaid lower limit, curing of the composition may be insufficient. If the curing promoter (D) is contained more than the aforesaid upper limit, storage stability of the composition or storage stability of a B-staged composition may be worse.

When a phenolic resin is used as the curing agent (B), the curing promoter (D) is preferably selected from tetraphenylphosphine-tetraphenylborate and derivatives thereof represented by the following formula (1) and imidazol, particularly methylol imidazol derivatives represented by the following formula (2):

wherein $R^1$ to $R^8$, which may be the same or different, are hydrogen atoms, hydrocarbon groups having 1 to 10 carbon atoms, or halogen atoms;

wherein $R^9$ is a methyl or methylol group, and $R^{10}$ is a hydrocarbon group having 1 to 10 carbon atoms.

(E) Diluent

The present die bonding agent may comprise (E) a diluent such as toluene, xylene, hexane, heptane, ethanol, isopropyl alcohol, acetone and methyl ethyl ketone.

Optional Components

In addition to the aforesaid components, the present composition can contain an optional additive in such an amount that it does not adversely affect the composition. Examples of the additives include silane coupling agents, flame retardants, ion trapping agents, wax, colorants, and adhesion aids.

Examples of the silane coupling agent include γ-glycidoxypropyltrimethoxysilane, γ-glycidoxypropylmethyldiethoxysilane, γ-glycidoxypropyltriethoxysilane, p-styryltrimethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-β(aminoethyl)γ-aminopropylmethyldimethoxysilane, N-β(aminoethyl)γ-aminopropyltrimethoxysilane, N-β(aminoethyl)γ-aminopropyltriethoxysilane, γ-aminopropyltrimethoxysilane, γ-aminopropyltriethoxysilane, N-phenylγ-aminopropyltrimethoxysilane, γ-mercaptopropylmethyldimethoxysilane, γ-mercaptopropyltrimethoxysilane, bis(triethoxypropyyl) tetrasulfide, and γ-isocyanate propyltriethoxysilane. A mixture of two or more of these can be used. Among these, γ-glycidoxypropyltrimethoxysilane is preferred.

When the aforesaid coupling agent is used, it is contained in the die bonding agent usually in an amount of from 0.1 to 5.0, preferably from 0.3 to 3.0 parts by weight per total 100 parts by weight of the die bonding agent.

The die bonding agent of the present invention can be prepared by know methods, for example, mixing the components with a mixer or a roller mill. Sequence of the mixing, duration, temperature, and pressure can be adjusted as needed.

The die bonding agent of the present invention may be used according to known methods: For example, the die bonding agent is applied on a substrate with a dispenser or a printer, on which a chip is bonded with a die bonder, followed by curing in a batch or continuous oven. Before bonding the chip, the applied die bonding agent may be semi-cured, i.e., B-staged. Preferably, post curing is performed after the curing step to increase adhesion strength.

EXAMPLES

The present invention is further explained with reference to the following Examples, but not limited thereto.

Materials Used

Epoxy resin: Bisphenol-A type epoxy resin having an epoxy equivalent of 180, sold under the trade name of RE310S from Nihon Kayaku, Co., Ltd.

Phenolic resin: Phenol novolac resin having an epoxy equivalent of 110 sold under the trade name of DL92 from Meiwa Plastic Industries, Ltd.

Silicone-modified epoxy resin-1 prepared in Preparation Example 1

Silicone-modified phenolic resin-2 prepared in Preparation Example 2

Curing promoter: Tetraphenylphosphine-tetraphenylborate sold under the trade name of TPP-K from Hokko Chemical Industry Co., Ltd.

Silica-1: Spherical fused silica having an average particle size of 0.8 μm, maximum particle size of 3 μm sold under the trade name of SE2030 from Admatechs Co., Ltd Silica-2: Spherical fused silica treated with KBM-403 having an average particle size of 0.8 μm, maximum particle size of 3 μm sold under the trade name of SE2030-SEE from Admatechs Co., Ltd

Adhesion promoter: Silane coupling agent sold under the trade name of KBM-403 from Shin-Etsu Chemical Co., Ltd.

Diluent: Carbitol acetate

Synthesis of Silicone-modified Resins

Preparation Example 1

In a flask equipped with a stirring blade, a dropping funnel, a thermometer, an ester adapter and a reflux condenser, 42.0 g (0.10 mole) of the epoxy resin of the formula (12) shown below and 168.0 g of toluene were placed and subjected to azeotropic dehydration at 130° C. for 2 hours. After cooling the mixture of the epoxy resin and toluene to 100° C., 0.5 g of a catalyst, CAT-PL-50T, ex Shin-Etsu Chemical Co., Ltd, was added dropwise to the mixture. Immediately after the completion of the addition, a mixture of 36.3 g (0.05 mole) of the organopolysiloxane of the formula (13) shown below and 145.2 g of toluene was added dropwise in about 30 minutes and then heated at 100° C. for 6 hours. By removing toluene, transparent yellowish liquid, hereinafter referred to as silicone-modified epoxy resin (C), was obtained which had a viscosity of 5 Pa·s at 25° C., an epoxy equivalent of 400 and an organopolysiloxane content of 46.4 parts by weight.

Preparation Example 2

In a flask equipped with a stirring blade, a dropping funnel, a thermometer, an ester adapter and a reflux condenser, 30.8 g (0.10 mole) of the phenolic resin of the formula (14) shown below and 123.2 g of toluene were placed and subjected to azeotropic dehydration at 130° C. for 2 hours. After cooling the mixture of the phenolic resin and toluene to 100° C., 0.5 g of a catalyst, CAT-PL-50T, ex Shin-Etsu Chemical Co., Ltd, was added dropwise to the mixture. Immediately after the completion of the addition, a mixture of 36.3 g (0.05 mole) of the organopolysiloxane of the formula (13) and 145.2 g of toluene was added dropwise in about 30 minutes and then heated at 100° C. for 6 hours. By removing toluene, transparent brownish liquid, hereinafter referred to as silicone-modified curing agent (D), was obtained which had a viscosity of 20 Pa·s at 25° C., a phenolic equivalent of 340 and an organopolysiloxane content of 54.1 parts by weight.

(14)

Examples 1-4, Comparative Examples 1 and 2

Die bonding agents were prepared by mixing the components in the amounts as shown in Table 1 with a planetary mixer at 25° C. and then passed in a three-roller mill at 25° C. followed by re-mixing with a planetary mixer at 25° C. The die bonding agents obtained were tested according to the following methods (a) to (g). The results are as shown in Table 1 in which "Ex." stands for Example and "Comp. Ex." stands for Comparative Example.

Preparation of Test Pieces

Figure 11:
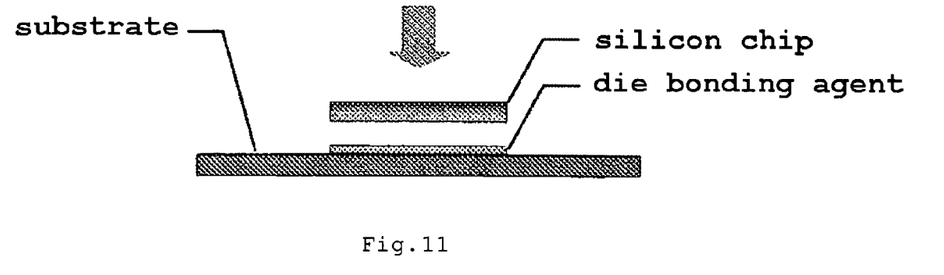
FIG. 11 is a cross-sectional view of a semiconductor device prepared in the present Example.

As shown in FIG. 11, a die bonding agent was applied in a size of 12 mm×12 mm×50 μm on a 35 mm×35 mm×200 μm-BT substrate coated with 20-μm thick solder resist. On the applied die bonding agent layer, a 12.5 mm×12.5 mm×300 μm silicon chip coated with silicon nitride was bonded in conditions of 50° C./100 g/0.1 sec in Examples 1, 3, and Comparative Example 1, and in conditions of 25° C./100 g/0.1 sec in Examples 2, 4 and Comparative Example 2, followed by curing at 150° C. for 4 hours including post curing for 2.5 hours.

Twenty test pieces prepared as above were cut along a line-symmetric axis of the semiconductor chip. Cross-sectional photographs of the test piece were taken in which distances A-B and B-C were determined. The number of test pieces, per total 20 test pieces, having a longer distance B-C than distance A-B was counted.

Similarly, the number of test pieces, per total 20 test pieces, having no fillet protruded from an imaginary line connecting points A and C was counted.

(g) Overall Rating

A composition which showed test results of 0/20 both in tests (e) and (f) was rated as "good", and the one which failed to show the good results was rated as "no good."

TABLE 1

|  | Ex. 1 | Ex. 2 | Ex. 3 | Ex. 4 | Comp. Ex. 1 | Comp. Ex. 2 |
|---|---|---|---|---|---|---|
| Epoxy resin | 34.6 | 34.6 | 0 | 0 | 34.6 | 34.6 |
| Phenolic resin | 0 | 0 | 21.6 | 21.6 | 0 | 0 |
| Silicone-modified epoxy resin-1 | 0 | 0 | 78.4 | 78.4 | 0 | 0 |
| Silicone-modified phenolic resin-2 | 65.4 | 65.4 | 0 | 0 | 65.4 | 65.4 |
| Curing promoter | 1 | 1 | 1 | 1 | 1 | 1 |
| Silica-1 | 0 | 102.5 | 0 | 102.5 | 102.5 | 0 |
| Silica-2 | 102.5 | 0 | 102.5 | 0 | 0 | 102.5 |
| Adhesion promoter | 1.5 | 1.5 | 1.5 | 1.5 | 1.5 | 1.5 |
| Diluent | 0 | 10.3 | 0 | 10.3 | 0 | 10.3 |
| (a) Viscosity 0.5 rpm [Pa·s] | 11 | 13 | 12 | 17 | 6.5 | 10 |
| @ room temp. or 5 rpm [Pa·s] 50° C. | 6.1 | 4.1 | 7.5 | 6.2 | 8.1 | 8.3 |
| (b) Viscosity Ratio @ room temp. or 50° C. | 1.8 | 3.2 | 1.6 | 2.7 | 0.8 | 1.2 |
| (c) Viscosity 0.5 rpm [Pa·s] | 220 | 180 | 190 | 180 | 60 | 220 |
| @ 150° C. 5 rpm [Pa·s] | 240 | 130 | 270 | 150 | 140 | 120 |
| (d) Viscosity Ratio @150° C. | 0.9 | 1.4 | 0.7 | 1.2 | 0.4 | 1.8 |
| (e) A-B distance vs. B-C distance | 0/20 | 0/20 | 0/20 | 0/20 | 10/20 | 0/20 |
| (f) Protrusion of a fillet | 0/20 | 0/20 | 0/20 | 0/20 | 0/20 | 16/20 |
| (g) Overall Rating | Good | Good | Good | Good | No good | No good |

Test Methods (a) Viscosity and (b) Viscosity Ratio at Room Temperature or 50° C.

An aliquot of 0.5 ml of a die bonding agent was placed in a Brook Field viscometer and a viscosity was measured using a No. 51 spindle at 0.5 rpm and 5 rpm at 50° C. in Examples 1, 3 and Comparative Example 1, or at 25° C. in Examples 2, 4 and Comparative Example 2. A viscosity ratio was calculated by dividing a viscosity at 0.5 rpm by that at 5 rpm.

(c) Viscosity and (d) Viscosity Ratio at 150° C.

An aliquot of 0.5 ml of a die bonding agent was placed on a stage of a Brook Field viscometer placed in an oil bath and viscosity was measured using a No. 51 spindle at 0.5 rpm and then 5 rpm in 5 minutes.

(e) Comparison Between Distances A-B and B-C, and (f) Observation for Protrusion of a Fillet As is found from Table 1, a die bonding agent having specific viscosity ratio both in die bonding and curing processes can from good fillets, allowing downsizing of a semiconductor device. The die bonding agent and the method of the present invention are suitable for producing downsized and highly reliable semiconductor devices.

The invention claimed is:

1. A die bonding agent consisting essentially of (A) an epoxy resin, (B) a curing agent, and (C) an inorganic filler, at least a part of the epoxy resin (A) or the curing agent (B) being a silicone-modified resin having a silicone residue in a molecule, the die bonding agent having a viscosity ratio, V1/V2, ranging (i) from 1.5 to 4 at a temperature of from room temperature to 50° C., and (ii) from 0.5 to less than 1.5 at a temperature at which the die bonding agent hardens in 0.5 hour to 1.5 hours, the viscosities being measured in 10 minutes after the die bonding agent is placed on a sample stage of a Brook Field viscometer, wherein V1 is a viscosity measured by stirring 0.5 ml of the die bonding agent with a No. 51 spindle at 0.5 rpm and V2 is a viscosity measured by stirring 0.5 ml of the die bonding agent with a No. 51 spindle at 5 rpm in the Brook Field viscometer.

2. The die bonding agent according to claim 1, wherein the die bonding agent further comprises (D) a curing promoter.

3. The die bonding agent according to claim 1 or 2, wherein the viscosity ratio, V1/V2, ranges
  (i) from 1.5 to 3.5 at a temperature of from room temperature to 50° C., and
  (ii) from 0.8 to 1.4 measured at a temperature of from 130 to 170° C. in 10 minutes after the die bonding agent is placed on a sample stage of the Brook Field viscometer.

4. A semiconductor device comprising at least one semiconductor chip bonded to a substrate via a die bonding agent, the semiconductor device comprising a fillet which is composed of the die bonding agent and which has such a cross-sectional shape along a line-symmetric axis of the semiconductor chip that
  (I) a distance between point B and point C is shorter than a distance between point A and point B, and
  (II) the cross-sectional shape does not protrude out of an imaginary line connecting point A with point C, wherein point A is a highest point of the fillet in contact with a side surface of the semiconductor chip, point B is a foot of an imaginary line drawn from point A perpendicularly to the substrate, and point C is a farthest point of the fillet in contact with the substrate from the side surface of the semiconductor chip, wherein
  the die bonding agent consists essentially of (A) an epoxy resin, (B) a curing agent, and (C) an inorganic filler, at least a part of the epoxy resin (A) or the curing agent (B) being a silicone-modified resin having a silicone residue in a molecule, the die bonding agent having a viscosity ratio, V1/V2, ranging
  (i) from 1.5 to 4 at a temperature of from room temperature to 50° C., and
  (ii). from 0.5 to less than 1.5 at a temperature at which the die bonding agent hardens in 0.5 hour to 1.5 hours, the viscosities being measured in 10 minutes after the die bonding agent is placed on a sample stage of a Brook Field viscometer, wherein V1 is a viscosity measured by stirring 0.5 ml of the die bonding agent with a No. 51 spindle at 0.5 rpm and V2 is a viscosity measured by stirring a 0.5 ml of the die bonding agent with a No. 51 spindle at 5 rpm in the Brook Field viscometer.

5. The semiconductor device according to claim 4, wherein the fillet comprises a cured epoxy resin.

6. A method of evaluating or controlling quality of a die bonding agent to be used for a semiconductor chip in a semiconductor device production process, the method comprising the steps of
  determining a viscosity ratio, V1/V2,
  (i) at a temperature ranging from room temperature to 50° C., and
  (ii). at a temperature at which the die bonding agent hardens in 0.5 to 1.5 hours, the viscosities being measured in 10 minutes after the die bonding agent is placed on a sample stage of a Brook Field viscometer, wherein V1 is a viscosity measured by stirring 0.5 ml of the die bonding agent with a No. 51 spindle at 0.5 rpm and V2 is a viscosity measured by stirring a 0.5 ml of the die bonding agent with a No. 51 spindle at 5 rpm in the Brook Field viscometer, wherein
  the die bonding agent consists essentially of (A) an epoxy resin, (B) a curing agent, and (C) an inorganic filler, at least a part of the epoxy resin (A) or the curing agent (B) being a silicone-modified resin having a silicone residue in a molecule, the die bonding agent having a viscosity ratio, V1/V2, ranging
  (i) from 1.5 to 4 at a temperature of from room temperature to 50° C, and
  (ii). from 0.5 to less than 1.5 at a temperature at which the die bonding agent hardens in 0.5 hour to 1.5 hours.

7. A die bonding agent consisting essentially of:
  (A) an epoxy resin;
  (B) a curing agent;
  (C) an inorganic filler;
  (D) a curing promoter;
  an adhesion promoter; and
  optionally one or more additives selected from the group consisting of a diluent, flame retardant, ion trapping agent, wax, colorant and adhesion aid,
  at least a part of the epoxy resin (A) or the curing agent (B) being a silicone-modified resin having a silicone residue in a molecule, the die bonding agent having a viscosity ratio, V1/V2, ranging
  (i) from 1.5 to 4 at a temperature of from room temperature to 50° C., and
  (ii) from 0.5 to less than 1.5 at a temperature at which the die bonding agent hardens in 0.5 hour to 1.5 hours, the viscosities being measured in 10 minutes after the die bonding agent is placed on a sample stage of a Brook Field viscometer, wherein V1 is a viscosity measured by stirring 0.5 ml of the die bonding agent with a No. 51 spindle at 0.5 rpm and V2 is a viscosity measured by stirring 0.5 ml of the die bonding agent with a No. 51 spindle at 5 rpm in the Brook Field viscometer.

8. The die bonding agent according to claim 7, wherein said adhesion promoter is a silane coupling agent.

9. The die bonding agent according to claim 7, which contains a diluent.

10. The die bonding agent according to claim 7, which does not contain a diluent.

* * * * *